United States Patent [19]

Kramer et al.

[11] Patent Number: 4,983,921
[45] Date of Patent: Jan. 8, 1991

[54] RAPID CALIBRATION OF NUTATION ANGLES IN MRI

[75] Inventors: David M. Kramer, San Rafael; Joseph W. Carlson, Kensington, both of Calif.

[73] Assignee: The Regents of the University of California, Oakland, Calif.

[21] Appl. No.: 395,841

[22] Filed: Aug. 18, 1989

[51] Int. Cl.$^5$ .................................................. G01R 33/20
[52] U.S. Cl. ..................................................... 324/309
[58] Field of Search ............... 324/300, 307, 309, 310, 324/311, 312, 313, 314, 318, 322; 128/653 A

[56] References Cited

U.S. PATENT DOCUMENTS

| | | | |
|---|---|---|---|
| 4,297,637 | 10/1981 | Crooks et al. | 324/309 |
| 4,318,043 | 3/1982 | Crooks et al. | 324/309 |
| 4,471,305 | 9/1984 | Crooks et al. | 324/309 |
| 4,599,565 | 7/1986 | Hoenninger et al. | 324/309 |
| 4,684,891 | 4/1987 | Feinberg | 324/309 |
| 4,739,267 | 4/1988 | LeRoux et al. | 324/314 |
| 4,788,501 | 11/1988 | LeRoux et al. | 324/314 |
| 4,866,386 | 9/1989 | Sattin | 324/314 |

OTHER PUBLICATIONS van der Muelen, P. and van Yperen, G. H., *Proceedings, Society of Magnetic Resonance in Medicine Fourth Annual Meeting*, p. 1129 (1985).

Sattin W., "A Rapid, High Signal-to-Noise RF Calibration System", *Proceedings, Society of Magnetic Resonance in Medicine Seventh Annual Meeting*, p. 1016 (1988).

Perman, W. H., Bernstein, M. A. and Sandstrom, J. C., "A Method for Correctly Setting the Flip Angle", *Magn. Reson. Med.*, vol. 9, p. 16 (1989).

Woessner, D. E., "Effects of Diffusion in Nuclear Magnetic Resonance Spin-Echo Experiments", *J. Chem. Phys.*, vol. 34, p. 2057 (1961).

*Primary Examiner*—Michael J. Tokar
*Attorney, Agent, or Firm*—Nixon & Vanderhye

[57] ABSTRACT

Techniques for rapidly and accurately calibrating RF transmitter parameters in a Nuclear Magnetic Resonance (NMR) magnetic resonance imaging (MRI) system obtain an estimate of flip (nutation) angle by determining a ratio of plural echo responses to a plural (e.g., three) RF pulse sequence. The ratio may be selected to be independent of relaxation times $T_1$ and $T_2$ so no relaxation waiting time between successive iterations is required. Accurate RF transmitter level calibration can be performed within on the order of three to five seconds. The techniques are robust and can discriminate flip angles over a wide range.

19 Claims, 7 Drawing Sheets

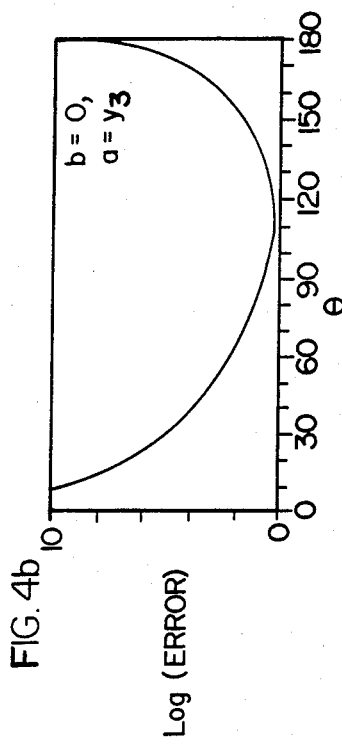
FIG. 4a
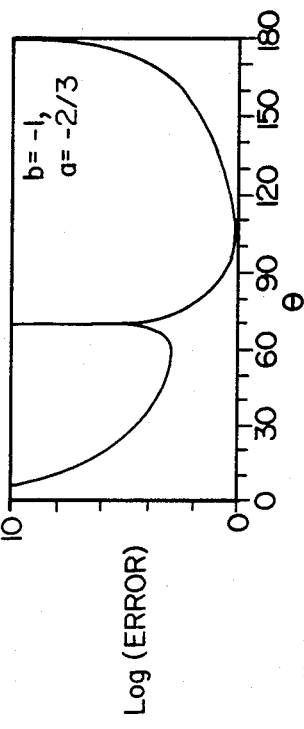
FIG. 4b
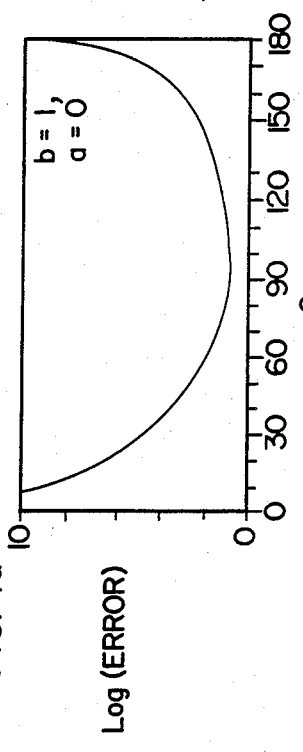
FIG. 4c
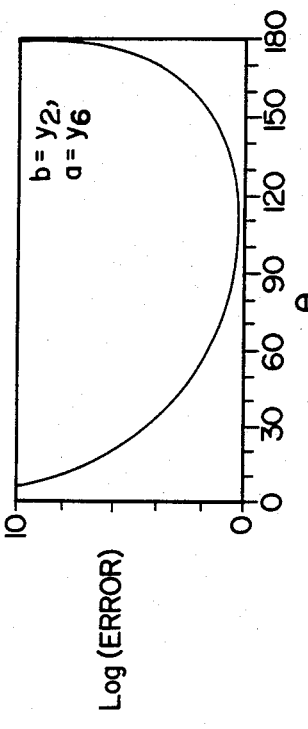
FIG. 4d
FIG. 4e
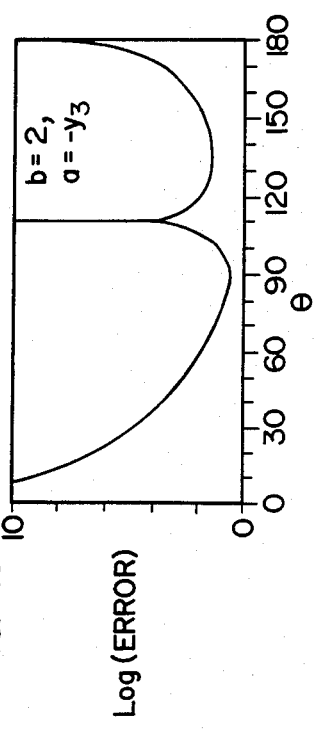
FIG. 4f

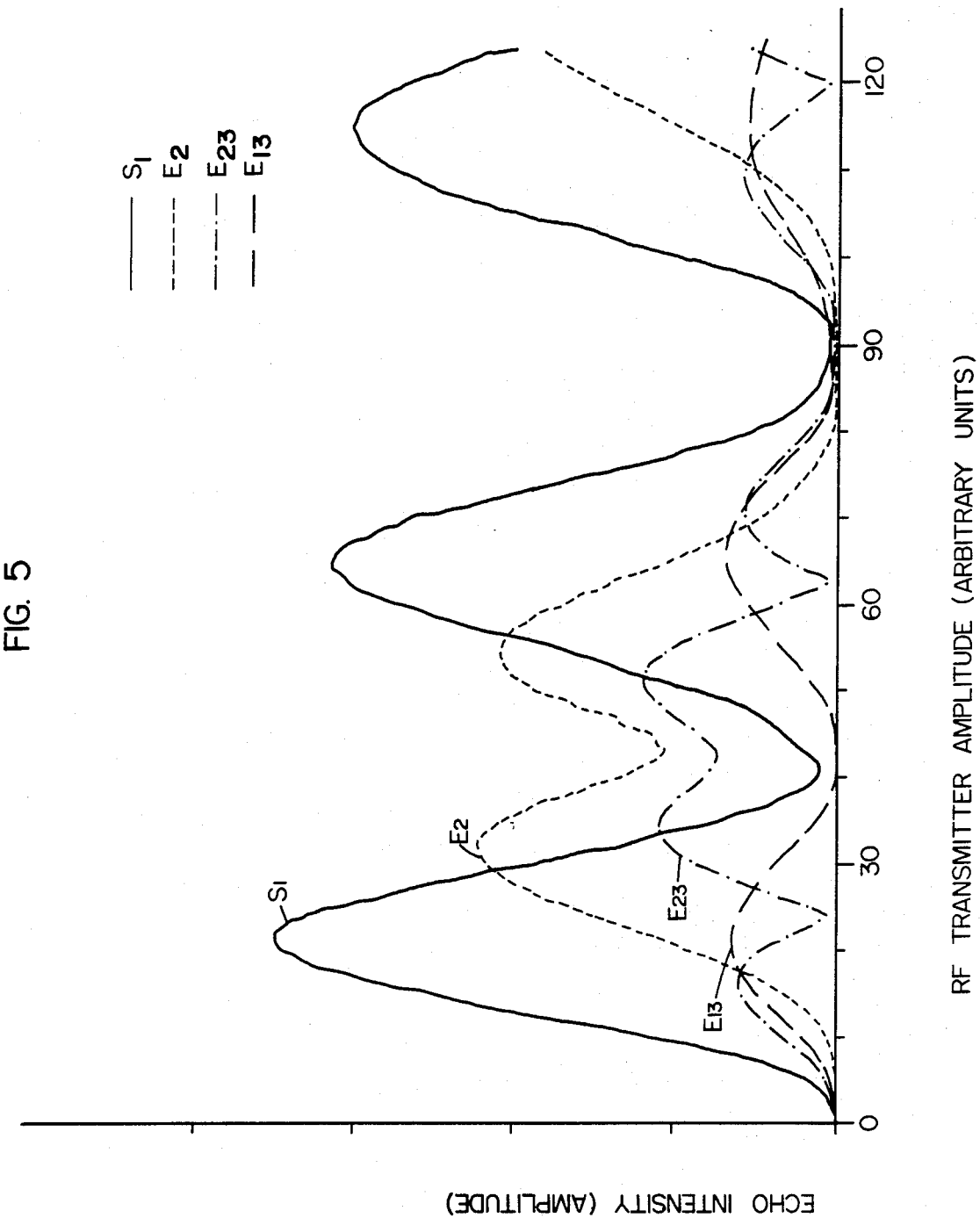

RAPID CALIBRATION OF NUTATION ANGLES IN MRI

FIELD OF THE INVENTION

The present invention relates to nuclear magnetic resonance (NMR), and more particularly to techniques for generating images using magnetic resonance (MRI). Still more particularly, the present invention relates to method and apparatus for rapidly and efficiently calibrating the parameters of RF (radio frequency) excitation pulses in MRI systems to provide desired nutation and/or "flip" angles.

BACKGROUND AND SUMMARY OF THE INVENTION

MRI systems are now in common use for a variety of medical and scientific imaging applications. The following generally relevant commonly-assigned U.S. Patents (incorporated by reference herein) describe some exemplary conventional MRI systems:
U.S. Pat. No. 4,297,637 to Crooks et al;
U.S. Pat. No. 4,318,043 to Crooks et al;
U.S. Pat. No. 4,471,305 to Crooks et al;
U.S. Pat. No. 4,599,565 to Hoenninger et al; and
U.S. Pat. No. 4,684,891 to Feinberg.

The following commonly assigned copending patent application generally relates to calibration of MRI systems:

Serial No. 181,440 of Ching filed 14 April 1988 entitled "MRI Compensated For Spurious NMR Frequency/Phase".

The following principles of NMR are well known. All nuclei with an odd number of protons or neutrons behave, in effect, like small magnets. When placed in a steady external magnetic field, the magnetic axes of such nuclei precess at an angle about the imposed field axis at the so-called Larmor frequency. The Larmor frequency is related to the magnetic field of the nucleus by the so-called gyromagnetic ratio characteristic of the particular type of nuclei. As is well known, the direction of the net angular momentum or "spin" of a group of nuclei (and thus their net magnetic axis) can be reoriented with respect to the external magnetic field by electromagnetic signals having a frequency equal to the Larmor frequency. The electromagnetic signal produces a stationary magnetic field in the rotating frame of reference to nutate (reorient) the net spin resonance (Larmor frequency) nuclei by an amount determined by the amplitude and duration of the electromagnetic signal.

Over a period of time, after removal of the electromagnetic signal, many magnetic moments will realign parallel to the external magnetic field. As nuclear realignment occurs, the relative phases of the individual spins begin to diverge as some nuclei precess faster and some slower then the central Larmor frequency. Thus, there is a gradual "dephasing" of the individual nuclear spins and a consequential loss of phase coherence. In a perfectly uniform magnetic field, such dephasing results from natural processes which cause nuclei to exchange energy with each other. The length of time that such dephasing takes to occur is related to the "spin-spin", or transverse, relaxation time constant $T_2$. During realignment, the nuclear moments also lose energy to their surroundings and thus relax, orienting parallel to the external magnetic field. The "spin-lattice", or longitudinal, relaxation time $T_1$, is related to this time of relaxation.

As is also well known, nuclear spins initially aligned with the external magnetic field and then reoriented transverse to the initial direction induce a characteristic RF signal in an appropriately oriented coil connected to an RF signal receiver. Initially upon reorientation, a relatively strong voltage is induced in the receiver coil which gradually decreases in amplitude due to field inhomogeneity and to energy exchange between spins. This signal is called the "free induction decay" (FID). As is also well known, a "spin echo" or subsequent representation of the FID can be generated by bringing the respective spins back into phase coherence through use of a so-called "pulse sequence." For example, if at a time $\tau$ after the nuclear spins are "flipped" or reoriented (for example, 90° with respect to initial direction) by a first electromagnetic pulse of appropriate frequency magnitude and duration, and then another electromagnetic signal of appropriate frequency, magnitude and duration is applied to effect 180° nutation of the nuclear spins (hereinafter referred to as "180° pulse"), the accumulation of further phase deviation for individual nuclear spins cause all of the individual spins to, at time $2\tau$, again come into phase coherence to produce a so-called "spin echo" of the FID.

Because the RF pulses "flip" the nuclei rotation axis, the reorientations (nutations) in the nuclei precession angle they generate are commonly referred to as "flip angles."

As is also well understood by those skilled in this art, calibration of the RF transmitter and associated coils and components is critical to providing desired results based upon the phenomenon discussed above and/or based on other MRI phenomenon. The amplitude and duration of an applied RF pulse determines the nutation angle imparted to the nuclei precession. Thus, to obtain desired nutation angles it is necessary to generate RF pulses having corresponding desired durations and amplitudes. However, such RF pulse excitation of an object (e.g., a human patient) to be imaged is typically provided by applying the RF pulse to an RF coil closely coupled to the object—so that RF coil loading (and thus resulting radiated RF amplitude) depends on the position, size and other parameters of the object. Consequently, it is typically necessary to recalibrate the RF transmitter for each image acquisition (i.e., "study" or set of scans). Moreover, if the patient is moved, the Quality Factor (Q) and loading of the coil changes and the RF amplitude within the particular area of interest within the patient's body thus also changes. This typically requires the RF transmitter output level to be recalibrated for each new patient and also each time the patient is moved with respect to the RF coil in order to ensure desired nutation angles are being obtained for given RF transmitter output levels.

It is possible to reduce or eliminate the necessity for repeated RF transmitter output recalibration by "de-Qing" the RF coil (so that coil loading is less affected by the positioning and other parameters associated with the patient). Unfortunately, a low Q RF coil uses RF power less efficiently, and the high magnetic field intensities provided by most superconducting magnet type MRI systems therefore require high Q RF coils.

In order to increase the patient throughput of an MRI system and for other reasons (e.g., to minimize the apprehension and anxiety some patients suffer because of long scanning times), it is important to perform the requisite RF tuning and calibration as rapidly as possible. The following is a somewhat representative listing of documents relating to decreasing the time required for RF calibration:

van der Muelen, P. and van Yperen, G. H., *Proceedings, Society of Magnetic Resonance in Medicine Fourth Annual Meeting* 1129 (1985);

Sattin W., "A Rapid, High Signal-to-Noise RF Calibration System", *Proceedings, Society of Magnetic Resonance in Medicine Seventh Annual Meeting* 1016 (1988);

Perman, W. H., Bernstein, M. A. and Sandstrom, J. C. "A Method For Correctly Setting the Flip Angle", *Magn. Reson. Med.* 9 16 (1989);

Woessner, D. E. "Effects of Diffusion in Nuclear Magnetic Resonance Spin-Echo Experiments", *J. Chem. Phys.* 34 2057 (1961);

U.S. Pat. No. 4,788,501, Leroux et al (1988);

U.S. Pat. No. 4,739,267, Leroux et al (1988).

Generally, known techniques for setting RF transmitter level include:

seeking a maximum spin echo signal in a sequence;

evaluating a ratio of signals in a three or more pulse sequence as a measure of flip angle; and cancelling a signal from a sequence of one or more pulses.

The first method is the simplest and generally takes the longest time to perform. Not only is a search for a maximum a time-consuming endeavor, but accuracy demands a delay of several $T_1$ relaxation times between repetitions. Commonly, the search for a maximum is automatically performed by obtaining NMR responses (e.g., four "spin echo" responses) from several different RF excitation levels (waiting at least a $T_1$ relaxation time between different excitation cycles) and then applying conventional maximum-determining algorithms (e.g., curve fitting) to the resulting data. The excitation/acquisition process must typically be repeated five or six times before the algorithm converges accurately, and thus typically requires at least 45 seconds to perform. The method must be repeated each time the patient is moved significantly with respect to the RF coil, and thus may introduce significant delay into complex studies requiring different patient orientations.

The Muelen and Sattin documents cited above teach a calibration method employing the first Hahn echo and stimulated echo from a three RF pulse sequence to measure the flip angle. Based on the estimate of the flip angle, a new level is chosen and the search continues. This is generally a more rapid procedure due to predicted nature of the duration. Generally once such methods are within range, the results they provide converge in two or three iterations. Muelen teaches generating an intensity ratio from a combination of the stimulated echo and first spin echo of a three pulse sequence of identical pulses, this ratio exhibiting no $T_2$ dependence and a weak $T_1$ dependence. Muelen teaches calculating the nutation angle from this intensity ratio. However, the $T_1$ dependence introduces error into the calculation.

Techniques which adjust the flip angle by seeking a cancellation in signal include an older method of setting a 180° pulse by minimizing the FID as well as the more recent Woessner publication cited above which sets a 90° pulse by minimizing an echo of the three pulse sequence.

In contrast to the methods described above, the present invention actually provides an expression by which flip angle can be calculated substantially independently of $T_1$ and $T_2$. The present invention provides a robust technique for calibrating RF transmitter parameters in an MRI system. This technique can discriminate flip angles over a wide range, and is more rapid than prior art calibration techniques while avoiding systematic errors due to relaxation during the pulse sequence.

Briefly, the present invention provides a technique for adjusting RF transmitter levels based on flip angles actually calculated from received responses. In the preferred embodiment, a three pulse sequence (e.g., $\theta$-$\tau$-$\theta$-$3\tau$-$\theta$) is transmitted to generate plural NMR responses (where each of the three pulses has the same amplitude and duration and thus provides the same nutation angle $\theta$. For example, the plural responses can include a "stimulated echo" response $S_1$ and "spin echo" responses $E_2$, $E_{13}$ and $E_{23}$.

It is possible to use various combinations of these echo responses to provide simplified expressions for the flip angle. In particular, we have discovered that certain ratios of the echoes are independent of both relaxation times $T_1$ and $T_2$, are not restricted with respect to the range of flip angles, and provide accurate results over the 0° to 180° flip angle range generally of interest. These ratios can be used to calculate (estimate) flip angle resulting from a particular RF transmitter output level and may thus be used to automatically adjust (or to assist an operator in manually adjusting) the transmitter level for particular desired flip angles. Iterations of the excitation/acquisition sequence can be performed without waiting for relaxation because the calculations are substantially independent of relaxation times—and may therefore, for example, provide accurate automatic RF level calibration within on the order of three to five seconds (as compared to forty-five seconds required by the typical prior art maximum seeking algorithm).

BRIEF DESCRIPTION OF THE DRAWINGS

These and other features and advantages of the present invention will be better and more completely understood by studying the following detailed description of a presently preferred exemplary embodiment in connection with the drawings, of which:

FIGS. 4a, 4b, 4c, 4d, 4e, and 4f are graphical illustrations of the behavior of the logarithm of rms error (in arbitrary units) of the estimate of $\theta$ for the six candidate algorithms corresponding to FIGURES 3(A)-3(F);

FIG. 5 is a graphical illustration of the four exemplary echo intensities over a broad range of RF amplitudes;

DETAILED DESCRIPTION OF THE DRAWINGS

Figure 1:
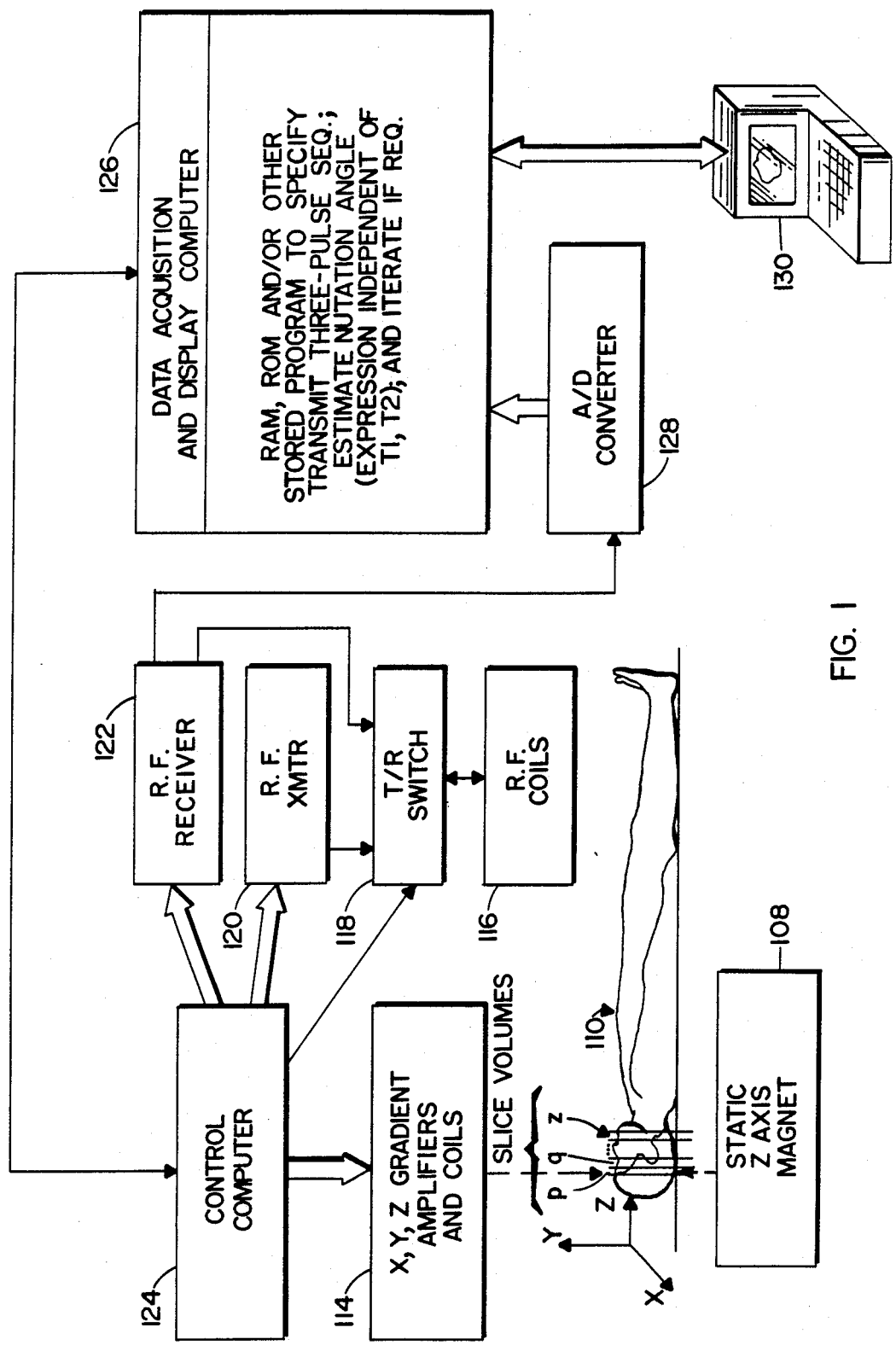
FIG. 1 is a high level block diagram of an exemplary MRI system with which the present invention may be used.

The novel calibration procedure utilized by this invention typically can be achieved by suitable alteration of stored controlling computer programs in an existing MRI type apparatus. The block diagram of FIG. 1 depicts the general architecture of an example of such a system.

Typically, a human or animal subject (or any other object to be imaged) 110 is placed within a static magnetic field. For example, the subject may lie along the z-axis of a static magnet 108 which establishes a substantially uniform magnetic field directed along the z-axis within the portion of the object 110 of interest. For example, contiguous parallel slice-volumes p,q . . . z may be located within the volume to be imaged. Gradients (e.g., a fixed weak z gradient) may be imposed within this z-axis directed magnetic field along mutually orthogonal x,y,z axes by a set of x,y,z gradient amplifiers and coils 114 to phase encode the resulting NMR response signals which are generally then read out with the gradients turned off. NMR RF signals are transmitted into the object 110 and NMR RF responses are received from the object via RF coils 116 connected by a conventional transmit/receive switch 118 to an RF transmitter 120 and RF receiver 122. As will be appreciated by those in the art, separate transmit and receive coils may be used in some installations in which case the T/R switch 118 may not be needed.

All of the prior mentioned elements may be controlled, for example, by a control computer 124 which communicates with a data acquisition and display computer 126. The latter computer 126 may also receive NMR responses via an analog-to-digital converter 128. A CRT display and keyboard unit 130 is typically also associated with the data acquisition and display computer 126.

Figure 2:
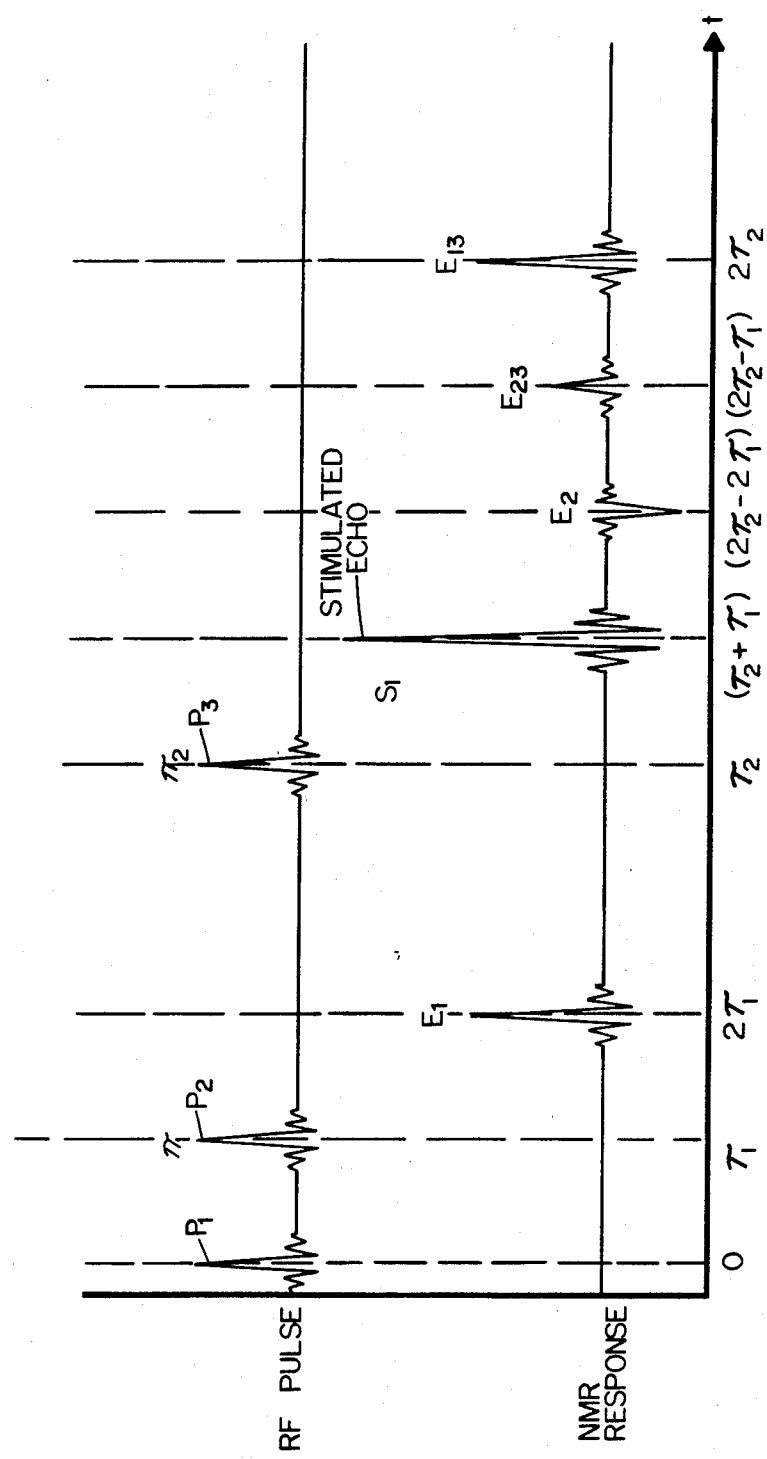
FIG. 2 is a graphical illustration of an exemplary pulse sequence and acquired echoes provided by the FIG. 1 system.

As will be apparent to those in the art, such an arrangement may be utilized so as to generate desired sequences of magnetic gradient pulses and NMR RF pulses and to measure the desired NMR RF responses in accordance with stored computer programs (see FIG. 2, which shows an exemplary "spin-echo" acquisition sequence used in the preferred embodiment to obtain calibration data). As depicted in FIG. 1, the NMR system of this invention will typically include RAM, ROM and/or other stored program media adapted (in accordance with the descriptions herein) to generate a particular plural excitation RF pulse sequence (preferably three pulses), receive one or more resulting "spin echo" NMR responses, actually calculate an estimate of nutation angle from a ratio of selected response intensities, adjusting a parameter of the RF excitation pulse generating apparatus, and possibly performing one or more re-iterations of this overall process to obtain calibration of RF transmit level with desired flip angle.

Consider FIG. 2, which shows the following three-pulse RF pulse sequence:

$$\theta_{(t=0)} - \theta_{(t=\tau_1)} - \theta_{(t=\tau_2)}.$$

As those skilled in the art understand, this pulse sequence comprises three RF pulses, all three pulses having the same level and duration (and thus all providing the same nutation angle $\theta$) with the pulse timing as stated. Provided $\tau_2 > 2\tau_1$, the following echoes (i.e., NMR echo responses) are generated after the third pulse:

(i) the stimulated echo $S_1$,
(ii) the second spin echo of the first two pulses, $E_2$,
(iii) the spin echo of the second and third pulse, $E_{23}$ and
(iv) the echo of the first and third pulse $E_{13}$. These responses are also shown in FIG. 2.

Note that an additional $E_1$ response not used in the preferred embodiment is generated between the second and third RF pulses.

The following expressions describe the four pulses:

$$S_1 = \tfrac{1}{2}M_o \sin^3\theta\, e^{-2\tau_1/T_2 - (\tau_2 - \tau_1)/T_1} \quad \text{at } t = \tau_2 + \tau_1$$

$$E_2 = -M_o \sin\theta \sin^4(\theta/2)\, e^{-(2\tau_2 - 2\tau_1)/T_2} \quad t = 2\tau_2 - 2\tau_1$$

$$E_{23} = M_z(\tau_1)\sin\theta \sin^2(\theta/2)\, e^{-(2\tau_2 - 2\tau_1)/T_2} \quad t = 2\tau_2 - \tau_1$$

$$E_{13} = \tfrac{1}{2}M_o \sin^3\theta\, e^{-2\tau_2/T_2} \quad t = 2\tau_2$$

The expression for $E_{23}$ uses the value of the residual magnetization just prior to the second RF pulse. If we assume $\tau_1, \tau_2 << T_1$, then this expression becomes $$E_{23} = M_o \cos\theta \sin^2(\theta/2)\, e^{-(2\tau_2 - 2\tau_2)/T_2}$$

Notice this signal passes through zero at $\theta = 90°$. This is the echo signal which was used in some prior art techniques for RF level settings. Notice also that only $E_{23}$ is a bipolar signal; all other echoes are either always positive or always negative for positive angles less than 180 degrees. There are more general expressions (i.e., generalizations of the expressions described above for echo intensities with different flip angles defined by different pulses in the RF pulse sequence.

We wish to look for combinations of $S_1$, $E_2$, and $E_{13}$ that are linear in $M_o$ and have the same $T_2$ dependence as $E_{23}$, such that an appropriate ratio can be formed from which to estimate $\theta$. Let $$A = S_1^a(-E_2)^b E_{13}^{1-a-b}.$$

Further, let $\tau_2 = f\tau_1$ leading to the following $T_2$ dependence of A:

$$e^{-[2a(1-f) - 2b + 2f]\tau_1/T_2}.$$

For this to be the same dependence as $E_{23}$ then $$a = \frac{b-1}{1-f}.$$

The trigonometric part of A is:

$$M_o 2^{\frac{3-2f}{1-f}(b-1)} \sin^{3-2b}\theta \sin^{4b}\theta/2.$$

We can now look at the ratio $A/E_{23}$ and select values for the parameters f and b to yield the desired algorithms for finding $\theta$. In general we have $$\frac{E_{23}}{A} = 2^{\frac{1-b}{1-f}} \frac{1 - \tan^2\frac{\theta}{2}}{\tan^{2b}\frac{\theta}{2}}.$$

We consider several easily solvable cases: They are $b = -1, 0, \tfrac{1}{2}, 1,$ and 2 for a sequence in which $f = 4$ and the four spin echoes are equally spaced apart at $5\tau_1$, $6\tau_1$, $7\tau_1$, and $8\tau_1$. FIGS. 3(A)–3(E) are plots of these ratios as a function of $\theta$.

Given a measurement of $E_{23}/A$, $\theta$ can be calculated using the formulae:

$$b = -1 \quad \lambda^2 - \lambda + 2^{\frac{1}{3}}E_{23}/A = 0$$

$$b = 0 \quad \tan\theta/2 = (1 - 2^{\frac{1}{3}}E_{23}/A)^{\frac{1}{2}}$$

$$b = \tfrac{1}{2} \quad \tan\theta = 2^{5/6}A/E_{23}$$

$$b = 1 \quad \tan\theta/2 = (E_{23}/A + 1)^{-\frac{1}{2}}$$

$$b = 2 \quad \lambda^2 E_{23}/A + 2^{\frac{1}{3}}\lambda - 2^{\frac{1}{3}} = 0$$

where $\lambda = \tan^2(\theta/2)$. These are not the only solvable cases; other cases can be solved in closed form but involve solving cubic or quartic equations. In principle, any value of b can be used if one allows for a numerical solution of $\theta$.

We can also consider one case which does not use the signal from $E_{23}$. This case is the limit of b approaching infinity:

$$\frac{E_2}{(S_1 E_{13}^{(f-2)})^{(f-1)-1}} = -2^{(1-f)-1}\tan^2\frac{\theta}{2}$$

(Actually, this expression is the b'th root of $A/E_{23}$ in the limit; or it can be verified directly.) As will be appreciated, this expression simplifies to the following in the preferred embodiment with $f=4$:

$$\left(\frac{2E_2^3}{S_1 E_{13}^2}\right)^{\frac{1}{2}} = \tan^2\theta/2.$$

Figure 3A:
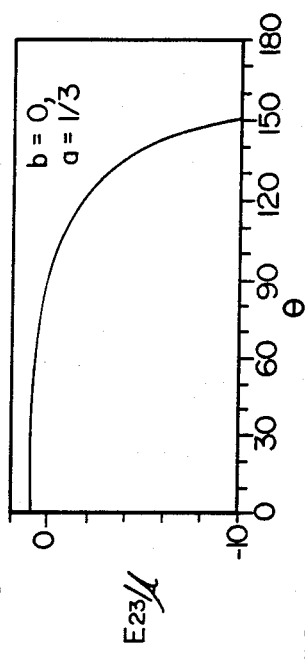
FIGS. 3A, 3B, 3C, 3D, 3E and 3F are graphical illustrations of $E_{23}/A$ versus $\theta$ for various values of b for a pulse sequence with f=4, with FIG. 3(A) showing a graph for b=$-$1, a=$-\frac{2}{3}$, FIG. 3(B) showing a graph for b=0, a=$\frac{1}{3}$, FIG. 3(C) showing a graph for b=$\frac{1}{2}$, a=1/6, FIG. 3(D) showing a graph for b=1, a=0, FIG. 3(E) showing a graph for b=2, a=$-\frac{1}{3}$, and FIG. 3(D) showing a graph for b$\rightarrow\infty$.
Figure 3B:
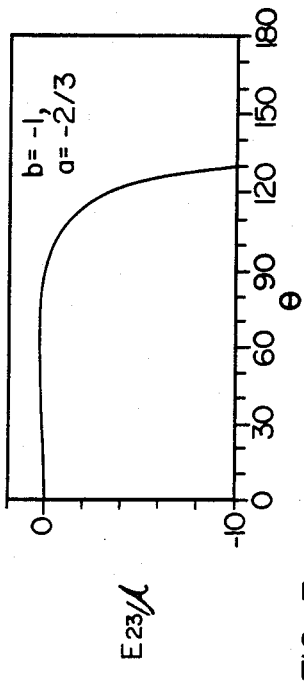
Figure 3C:
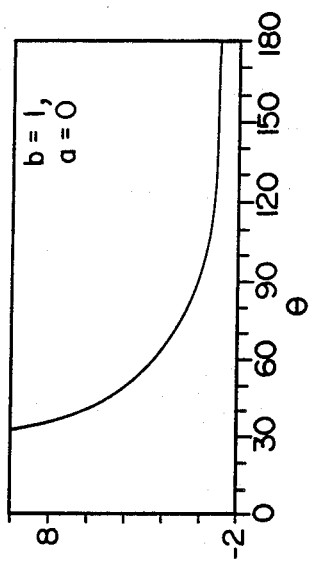
Figure 3D:
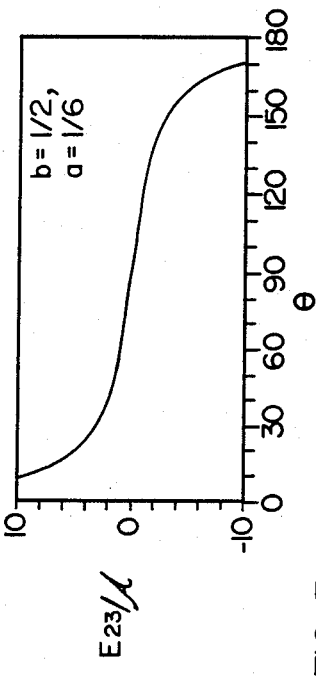
Figure 3E:
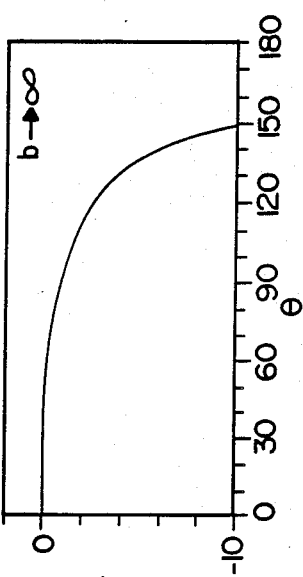
Figure 3F:
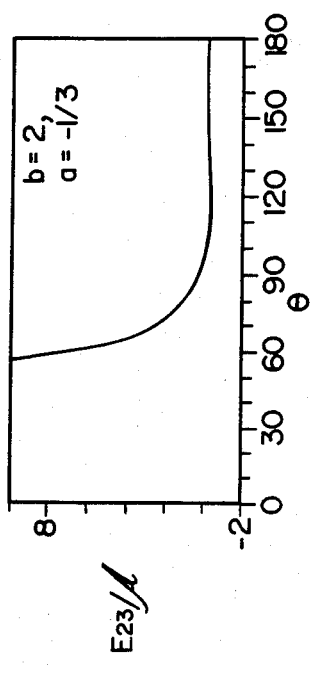

Since our expression for $E_{23}$ assumed that $T_1$ was much longer than the echo times, these cases eliminate the need for that assumption. This is the only quantity with no $T_2$ dependence which we can form out of the three other echoes. FIG. 3(F) shows the behavior of this expression as a function of $\theta$.

While the preferred embodiment uses three identical RF pulses in the excitation sequence in order to reduce computational complexity, it is possible to use a different number of RF pulses and/or to provide RF pulses with different amplitudes (and/or durations)—thus inducing different flip angles with different pulses in the sequence. For example, it might be desirable to use a three-pulse sequence of $\theta$-$2\theta$-$\theta$, or to use a pulse sequence having more (or possibly less) than three pulses (although we believe at least two pulses are necessary). One can find ratios of amplitudes of the resulting NMR echo responses to these more generalized sequences which are also substantially independent of $T_1$ and $T_2$. Moreover, the values for the factors a and b described above provide substantial independence of the $T_1$ and $T_2$ relaxation times even for these more general cases.

Certain cases of the possible methods show severe limitations. For example, the curves corresponding to $b = -1$ and 2 are not invertible over the whole range of $0° < \theta < 180°$. For $b=2$ this limits the range of measurable angles to be less than 109.5°. A more severe restriction occurs for $b = -1$; in this case the restriction on the angle is $\theta < 70.5°$.

In order to determine which of the many possible algorithms is most accurate, we determine the relative sensitivity of each technique towards error in the measurements. There are at least two separate issues to consider for signals acquired with noise: One concern is the relative sensitivity of all algorithms to random errors; and the other concern is the robustness of the measurement. By assumption, noise in the echo signal is a Gaussian white noise which is equal in rms amplitude for all measurements and is uncorrelated among the various signals.

Under these assumptions, the rms error in the calculated nutation angle, $\delta\theta$ in proportional to the rms error in the signals, $\delta S$, and is:

$$\delta\theta = \left| \frac{(1 - \tan^2\theta/2)\tan\theta/2\cos^2\theta/2}{M_0((b-1)\tan^2\theta/2 - b)} \right| \left( \frac{4(b-1)^2 e^{4\tau_1/T_2} + 2(f-1)\tau_1/T_1}{(f-1)^2\sin^6\theta} + \frac{b^2 e^{4(f-1)\tau_1/T_2}}{\sin^2\theta\sin^8\theta/2} + \frac{16(2-f)^2(1-b)^2 e^{4f\tau_1/T_2}}{(f-1)^2\sin^6\theta} + \frac{e^{4(f-1)\tau_1/T_2}}{\sin^2\theta\cos^2\theta\sin^2\theta/2} \right)^{\frac{1}{2}} \delta S.$$

The errors in the calculated angles show singularities whenever the first derivative of the curves of FIGS. 3(A)–3(F) vanishes. Intuitively, when a small change in $E_{23}/A$ corresponds to a large change in angle there should be a high sensitivity to noise.

The behavior of the rms error in the angle is shown in FIGS. 4(A)–4(F). These graphs correspond to the same cases as shown in FIGS. 3(A)–3(F). FIGS. 4(A)–(F) show the logarithm of the error in arbitrary units. In FIGS. 4A–4F we have neglected the $T_2$ dependence of the error estimate. This results in an underestimate of the error in all of the displayed curves. The absolute magnitude of the rms error depends on the unknown parameters $M_0$ (which is proportional to the spin density in the irradiated volume) and $\delta S$ (which is dependent on coil efficiency and receiver bandwidth). Therefore, FIGS. 4A–4F can only show the relative error among the various algorithms.

The overall noise sensitivity is similar for all the algorithms. We can see singularities in the case of $b=-1$ and 2 at the expected location of the crossovers in the curves. For small angles, $b=\tfrac{1}{2}$ and $b=1$ are slightly less sensitive to noise compared with the other algorithms. For large angles, $b=1$ is twice as sensitive to noise as the other methods. The overall least sensitive algorithm corresponds to $b=\tfrac{1}{2}$.

The second concern is in the robustness of the estimate. For example, the solution for $b=1$ is only invertible for $E_{23}/A > -1$. If a noisy measurement results in a value outside this range, the algorithm must deal with this as a special case. We can see that only $b=\tfrac{1}{2}$ makes no restrictions on the range of the measured quantities. We noted previously that all echoes other than $E_{23}$ have a fixed sign. Therefore, we may implement the algorithm of $b\to\leq$ and only acquire magnitude of the three other echoes. If this is the case, then this technique is also robust.

A plot of the measured intensity of the four echoes as a function of the transmitter amplitude is shown in FIG. 5 (the x axis in FIG. 5 is in increments of RF transmitter amplitude in arbitary units). These data were acquired on a commercial MRI system using a mineral oil phantom with an RF pulse length of 10 msec and $\tau_1=20$ msec. FIG. 5 shows only the magnitude of the echoes.

Notice in FIG. 5 that the curve for $E_{23}$ crosses zero at a slightly higher RF level than the maximum of $E_2$ or $E_{13}$.

The curves of FIG. 5 ideally should be the integrated intensity of the received signals. However, we have found that we can reduce susceptibly to the inherent DC offset of the RF receiver if Fourier transformations are applied to the signals and the analysis is performed on the first bin away from DC. This technique is preferable to phase alternation with signal averaging in the interest of shortest performance time.

Graphs of the calculated flip angle from the data of FIG. 5 are shown in FIGS. 6A–6F for all of the candidate algorithms. For these graphs, the data were manually edited to resolve ambiguities of two solution cases (such as $b = -1$ and $b = 2$) and to extend the calculated angle past 360°.

As we can see, certain of the algorithms provide accurate estimates over a wide range of flip angles. For very low flip angles, the calculated flip angle is uniformly poorly calculated. However, in an iterative updating scheme, the next RF amplitude will be higher and bring the amplitude into the range of an accurate calculation.

Figure 6B:
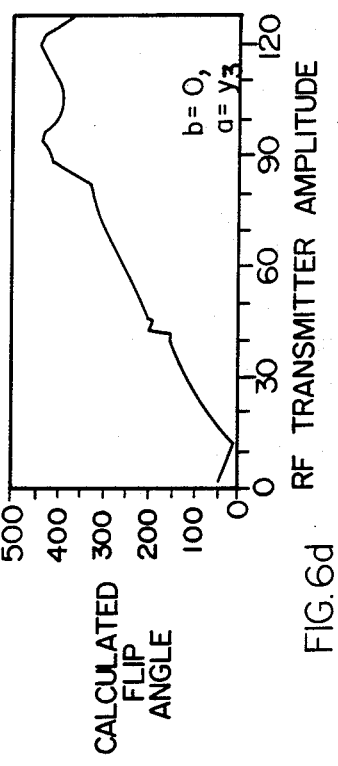
FIGS. 6a, 6b, 6c, 6d, 6e and 6f are graphical illustrations of calculated estimated the flip angle for each of the cases shown in FIGS. 3(A)-3(F)
Figure 6D:
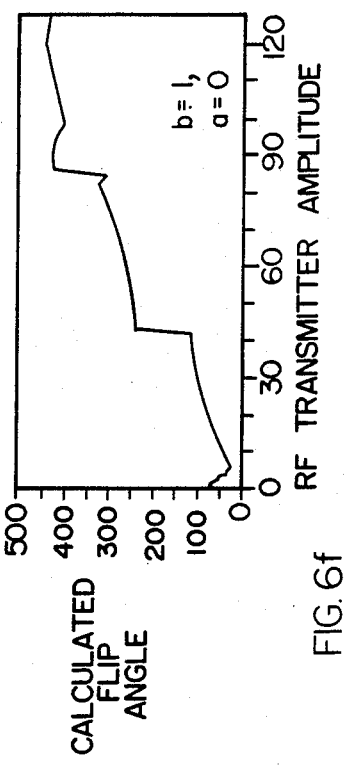
Figure 6F:
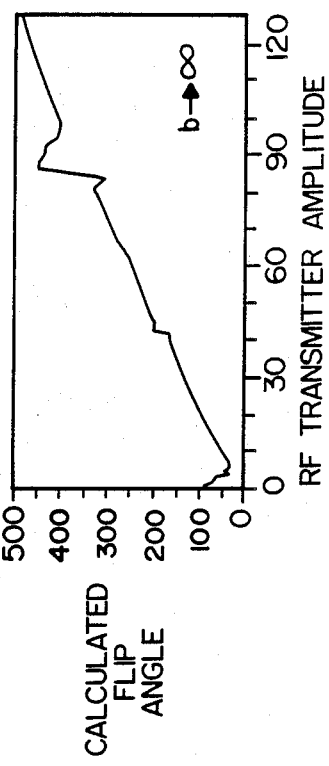
Figure 6A:
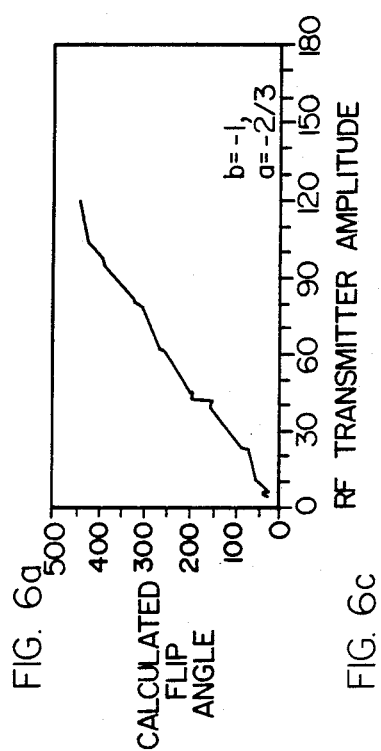
Figure 6C:
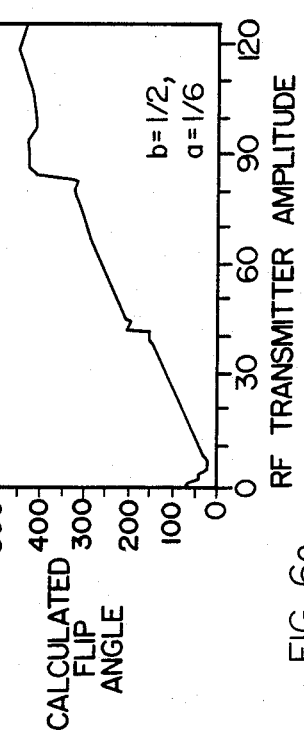
Figure 6E:
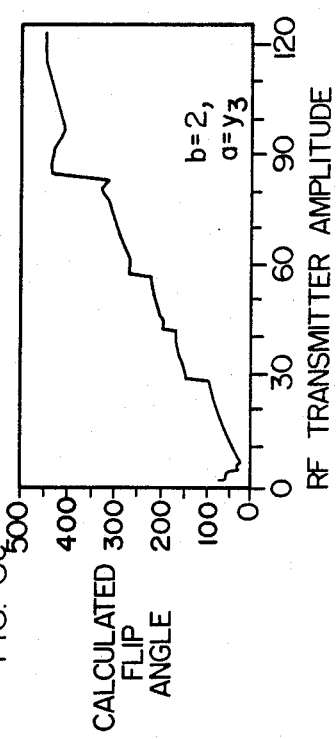

The calculation is more reliable close to 180°. The calculated flip angle in the region around 180° is most accurately calculated for the method that does not employ $E_{23}$. FIGS. 6(A) and 6(E) show regions of increased error in the regions of the turnover of the function. FIGS. 6(C) ($b=\frac{1}{2}$) and 6(F) ($b \to \infty$) show the most linear behavior over the entire range. In fact, using these two functions it is possible to measure angles from zero to 360 degrees (the angles shown in FIGS. 6(A)–6(F) above 360 degrees not resulting from calculation but instead being added to preserve the trend of the curves).

These methods only yield a range of flip angles in the range of 0° to 180° for a single iteration. However, when used as part of an iterative routine to set the RF level, the iteration is stable out to 270°. In the range of 180° to 270°, the measurement is inaccurate but will correctly result in a decrease in transmitter field. We are able to distinguish $\theta < 180°$ from $\theta < 180°$ by keeping track of relative phases of the signals of $S_1$. This allows a complete determination of flip angle, up to 360 degrees.

Figure 7:
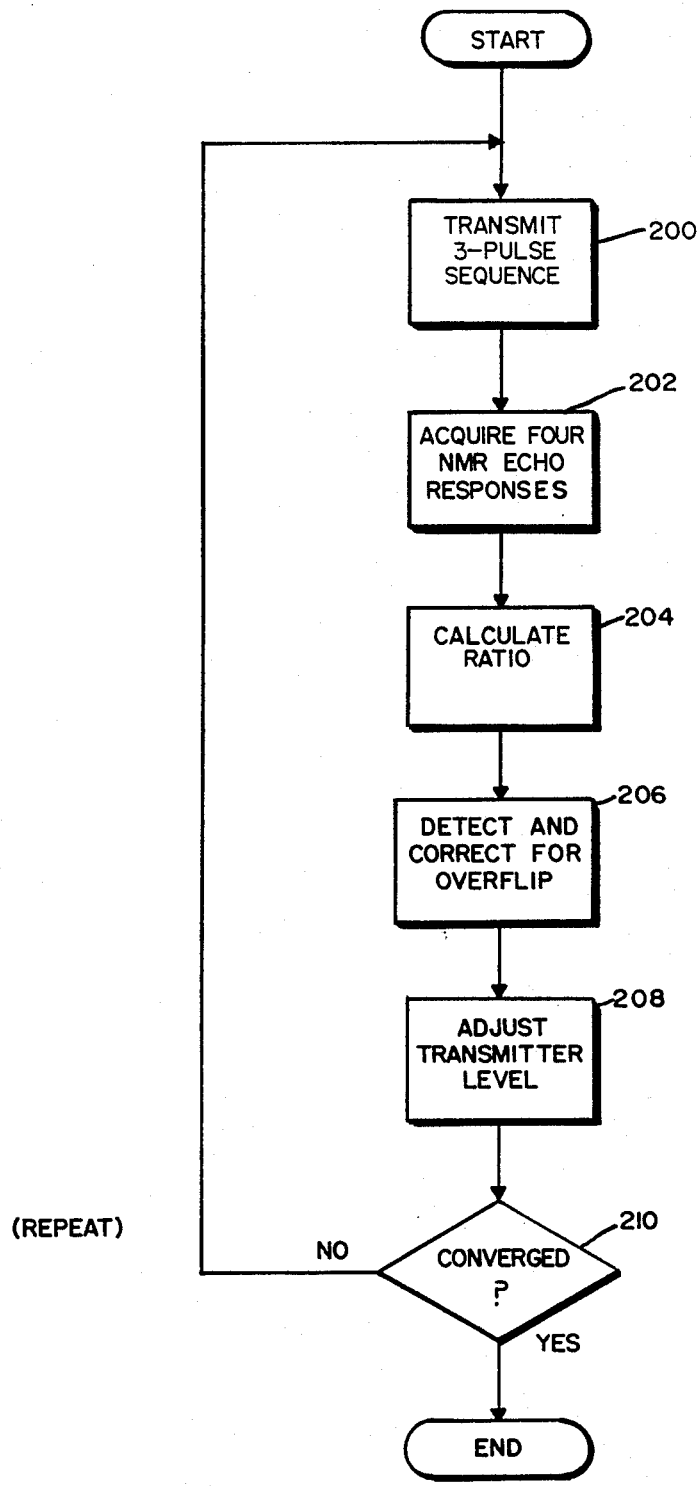
FIG. 7 is a flowchart of exemplary program control steps performed by the processor shown in FIG. 1.

FIG. 7 is a flowchart of exemplary program control steps for performing actual RF calibration of system 10. A trial three pulse sequence (e.g., using RF levels shown in the past to a least approximately yield a desired nutation angle) is first generated (block 200), and the resulting four NMR echo responses described above are acquired using conventional data acquisition techniques (block 202). Block 202 calculates a suitable ratio using one of the expressions discussed above to yield an estimate of the flip angle. If desired, detection and correction for "overflip" (as will be discussed shortly) can be performed at block 206. The calculated estimate of flip angle is then used to control readjustment of the RF transmitter level (block 208). A test is then performed to determine whether the calibration process has converged (e.g., by comparing estimated flip angle calculated by the just previous iteration of block 204 with a newly calculated value) (decision block 210) and further iterations of blocks 200-208 are performed if necessary. Typically, both of the preferred techniques (i.e., using $b=\frac{1}{2}$ and $b \to \infty$) converge in 2 or 3 iterations. Since we do not require $T_1$ decay between pulses, the repetition rate is determined only by the computer's ability to acquire the data and perform the calculation.

In our hands the results were quite satisfactory using $b=\frac{1}{2}$. However, we did notice a systematic inaccuracy in short $T_1$ samples. The source of the inaccuracy is due to the $\tau_1 < < T_1$ assumption. If we relax this constraint, then the echo term is $$E_{23} = M_0((\cos\theta - 1)e^{-\tau_2/T_1} + 1)$$
$$\sin\theta \sin^2(\theta/2)e^{-2(\tau_2 - \tau_1)T_2}$$

This signal vanishes at $$\theta = \cos^{-1}(1 - e^{\tau_2/T_1}) > 90°.$$

For a short $T_1$ sample, this error may be appreciable. In our work with a 20 msec interpulse time, the error on a mineral oil phantom ($T_1$ approximately equal to 125 msec) is roughly 10%. Notice that the curve of $E_{23}$ in FIG. 5 crosses zero at a 10% higher RF amplitude than the maximum of $E_2$ or $E_{13}$.

While this error is not enormous, there may be applications where the error is noticeable. For example, subcutaneous fat contributes a large amount of signal in surface coil imaging of the spine and may dominate the RF level setting algorithm. This would also become significant in the event that a mineral oil (or other very short $T_1$) phantom is used as a quality control standard. In such applications, any decrease in signal to noise will be noticed.

This problem may be overcome by using the method that does not use $E_{23}$. We have found it also to be a reliable technique and does not result in systematic errors.

As briefly discussed above, possible problems may arise if the flip angle is initially set to be greater than 270 degrees. In this case, the update increases the RF level and results in an overflip. It may be desirable therefore, to add the necessary logic to detect this condition and recover the proper transmitter setting. For example, the program can check whether it has converged on 540° (see FIG. 7, block 206). In addition, the data obtained at high flip angles is more likely to produce errors in estimates due to RF field inhomogeneities. These effects are visible in FIG. 5 since each successive local minimum and maximum on each of the echo signals is broadened and the maxima attenuated.

We have found the methods using $b=\frac{1}{2}$ and $b \to \infty$ to be very rapid and robust methods of adjusting RF amplitude. The entire process requires only a few seconds of data acquisition and consistently yields results that are as accurate as those provided by other, slower techniques.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. Apparatus for rapidly and accurately calibrating RF transmit parameters of a magnetic resonance imaging (MRI) including:
   processing means connected to receive intensity values corresponding to plural NMR spin-echo responses for calculating a ratio of said intensity values that is substantially independent of $T_1$ and $T_2$ relaxation times and for estimating flip angle in response to said calculated ratio; and control means for generating RF transmit parameter control signals in response to said estimated flip angle.

2. Apparatus as in claim 1 wherein said ratio is of the form $$\left( \frac{2E_2^3}{S_1 E_{13}^2} \right)^{\frac{1}{3}} = \tan^2 \theta/2.$$

3. Apparatus as in claim 1 wherein said ratio includes a weighting factor b selected from the set of $-1, 0, \frac{1}{2}, 1, 2$ and infinity.

4. Apparatus as in claim 1 wherein said ratio includes a weighting factor b selected from the set of $\frac{1}{2}$ and infinity.

5. Apparatus as in claim 1 wherein said processing means includes means for determining if said estimated flip angle exceeds a predetermined angle and means for preventing said control means from generating parameter control signals corresponding to excessive flip angles if said determining means reveals said estimated flip angle exceeds said predetermined angle.

6. Apparatus as in claim 1 further including means for transmitting a plural pulse RF pulse sequence in which each of said pulses in said RF pulse sequence has substantially the same amplitude.

7. Apparatus as in claim 1 wherein said processing means includes means for estimating a flip angle in a region around 180 degrees in response to a ratio of intensity values corresponding to the following NMR responses arising from an RF pulse excitation sequence including first, second and third RF pulses:

the stimulated echo $S_1$;

the spin echo $E_2$ of the first and second RF pulses; and the spin echo $E_{13}$ of the second and third RF pulses.

8. Apparatus as in claim 1 wherein said processing means includes means for estimating a flip angle in a region around 180 degrees in response to a ratio of intensity values corresponding to the following NMR responses arising from an RF pulse excitation sequence including first, second and third RF pulses:

the stimulated echo response $S_1$;

the spin echo response $E_2$ of the first and second RF pulses;

the spin echo response $E_{23}$ of the second and third RF pulses; and the spin echo response $E_{13}$ of the second and third RF pulses.

9. In a nuclear magnetic resonance imaging (MRI) system of the type including means for applying a magnetic field to an object to be imaged, RF transmitting means for generating RF pulses at levels and/or durations inducing corresponding nutation in the precession angle of NMR sensitive nuclei within said object, said nuclei having relaxation times $T_1$ and $T_2$ associated therewith, and RF receiving means for receiving NMR responses resulting from said induced nutation, a method of rapidly and accurately calibrating said RF levels and/or durations comprising the following steps:

(a) controlling said RF transmitter means to transmit a pulse sequence comprising a plurality of RF pulses, said RF pulses in said sequence having preset levels and/or durations, said RF pulses nutating the precession angle of said nuclei, relaxation of said nutated precession angle inducing a corresponding plurality of NMR echo responses;

(b) receiving said plurality of NMR echo responses with said RF receiving means;

(c) determining the intensities of said received plurality of NMR echo responses;

(d) computing a ratio of said determined intensities which is independent of said relaxation times $T_1$ and $T_2$;

(e) estimating the nutation in said precession angles in response to said computed ratio; and (f) calibrating said preset levels and/or durations of RF pulses generated by said RF transmitting means in response to said estimated nutation.

10. A method as in claim 9 wherein said controlling step (a) comprises the step of transmitting at least three RF pulses, each of said pulses having substantially the same amplitude.

11. A method as in claim 9 further including the step of interating said steps (a) through (f) without waiting for $T_1$ relaxation of said nuclei between iterations.

12. A method as in claim 9 wherein said computing step (d) comprises computing the following ratio that is substantially independent of the $T_1$ and $T_2$ relaxation times of said nuclei:

$$\frac{E_2}{(S_1 E_{13}^{(f-2)})^{(f-1)-1}} = -2^{(1-f)-1} \tan^2 \frac{\theta}{2}$$

13. A method as in claim 9 wherein said estimating step includes the steps of:

determining the phase of at least one of said echo responses; and determining the range of said estimated nutation in response to said determined phase.

14. A method as in claim 9 wherein said computing step (d) includes the steps of:

selecting a weighting factor b from the set of $-1, 0, \frac{1}{2}, 1, 2$ and infinity; and computing said ratio in response to said weighting factor and in response to said determined intensities.

15. A nuclear magnetic resonance imaging (MRI) system including:

means for applying a magnetic field to an object to be imaged;

RF transmitting means for generating RF pulses at levels and/or durations inducing corresponding nutation in the precession angle of NMR sensitive nuclei within said object;

control means coupled to said RF transmitter means for controlling said RF transmitter means to transmit a pulse sequence comprising a plurality of RF pulses said RF pulses in said sequence having preset levels and/or durations, said RF pulses nutating the precession angle of said nuclei, relaxation of said nutated precession angle inducing a corresponding plurality of NMR echo responses, said nuclei having relaxation times $T_1$ and $T_2$ associated therewith;

RF receiving means for receiving said plurality of NMR echo responses;

detecting means coupled to said RF receiving means for determining the intensities of said received plurality of NMR echo responses; and calibrating means, operatively coupled to said RF transmitting means and to said detecting means, for computing a ratio of said determined intensities which is independent of said relaxation times $T_1$ and $T_2$, for estimating the nutation in said precession angles in response to said computed ratio, and for calibrating said preset levels and/or durations of RF pulses generated by said RF transmitting means in response to said estimated nutation.

16. Apparatus as in claim 15 wherein:
said controlling means comprises means for controlling said RF transmitting means to transmit a sequence of at least three RF pulses, each of said pulses in said sequence having substantially the same amplitude; and
said calibrating means includes means for estimating the nutation angle corresponding to said pulse amplitude.

17. Apparatus as in claim 15 wherein said calibrating means includes means connected to receive said detected intensities for computing the following ratio of said intensities that is substantially independent of the $T_1$ and $T_2$ relaxation times of said nuclei:

$$\left(\frac{2E_2^3}{S_1 E_{13}^2}\right)^{\frac{1}{2}} = \tan^2 \theta/2.$$

18. Apparatus as in claim 15 wherein said calibrating means includes:
means coupled to said RF receiving means for determining the phase of at least one of said echo responses; and
means connected to receive said determined phase for determining the range of said estimated nutation in response to said determined phase.

19. A method for rapidly and accurately calibrating RF transmit parameters of a magnetic resonance imaging (MRI) of the type which generates an image of NMR sensitive nuclei, said method including the following steps:
(a) receiving intensity values corresponding to plural NMR spin-echo responses;
(b) calculating a ratio of said intensity values;
(c) estimating flip angle in response to said calculated ratio;
(d) repeating said steps (a)–(c) without waiting for relaxation of said NMR sensitive nuclei; and
(e) generating RF transmit parameter control signals in response to said estimated flip angle provided by at least one repetition of said step (d).

* * * * *